(12) United States Patent
Itoh et al.

(10) Patent No.: US 7,960,728 B2
(45) Date of Patent: Jun. 14, 2011

(54) METHOD OF MANUFACTURING TFT SUBSTRATE AND TFT SUBSTRATE

(75) Inventors: Yasuyoshi Itoh, Tokyo (JP); Yuichi Masutani, Tokyo (JP); Eiji Shibata, Kumamoto (JP); Kenichi Miyamoto, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 69 days.

(21) Appl. No.: 12/499,209

(22) Filed: Jul. 8, 2009

(65) Prior Publication Data

US 2010/0006839 A1   Jan. 14, 2010

(30) Foreign Application Priority Data

Jul. 10, 2008   (JP) ................................ 2008-179982

(51) Int. Cl.
   *H01L 23/58*   (2006.01)
   *H01L 29/76*   (2006.01)
   *H01L 31/00*   (2006.01)
   *H01L 31/036*  (2006.01)
   *H01L 31/112*  (2006.01)

(52) U.S. Cl. ............. 257/48; 257/66; 257/291; 257/443

(58) Field of Classification Search .................... 257/48, 257/66, 291, 233, 227, 439, 443, 655
   See application file for complete search history.

(56) References Cited

U.S. PATENT DOCUMENTS

| | | | |
|---|---|---|---|
| 6,255,130 B1 | 7/2001 | Kim | |
| 6,449,022 B1 * | 9/2002 | Fukata et al. | 349/44 |
| 7,026,688 B2 * | 4/2006 | Kim et al. | 257/331 |
| 7,381,601 B2 * | 6/2008 | Kim et al. | 438/197 |
| 7,648,883 B2 * | 1/2010 | Park | 438/289 |
| 2001/0019373 A1 | 9/2001 | Kobayashi et al. | |
| 2002/0106843 A1 | 8/2002 | Tsujimura et al. | |
| 2010/0194739 A1 * | 8/2010 | Takatori | 345/214 |

FOREIGN PATENT DOCUMENTS

| | | |
|---|---|---|
| JP | 11-242241 | 9/1999 |
| JP | 2000-164886 | 6/2000 |
| JP | 2002-244586 | 8/2002 |
| JP | 2005-93902 | 4/2005 |
| WO | WO 2004/038780 A1 | 5/2004 |

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

In a method of manufacturing a TFT substrate in accordance with an exemplary aspect of the present invention, an intrinsic semiconductor film, an impurity semiconductor film, and a conductive film for source lines are formed in succession, and a resist having a thin-film portion and a thick-film portions is formed on the conductive film for source lines. Then, etching is performed by using the resist as a mask, and after that, a part of the conductive film for source lines is exposed by removing the thin-film portion of the resist. Next, the exposed conductive film for source lines is etched by using the thick-film portions of the resist a mask, so that the impurity semiconductor film is exposed. Then, by etching the exposed impurity semiconductor film, a back channel region of a TFT 108 is formed. Further, a dummy back channel region 18a, which is irrelevant to the operation of the finished product, is also formed in a portion other than the TFT 108 region.

6 Claims, 11 Drawing Sheets

METHOD OF MANUFACTURING TFT SUBSTRATE AND TFT SUBSTRATE

BACKGROUND OF THE INVENTION

1. Field of the Invention

The present invention relates to a method of manufacturing a TFT substrate and a TFT substrate.

2. Description of Related Art

In recent years, liquid crystal display devices, which are characterized by their energy-saving and space-saving capabilities, have been taking the place of traditional CRTs and becoming widespread in the field of display devices using semiconductor devices. In such liquid crystal display devices, active matrix type TFT array substrates have become widely used. In a TFT array substrate, a plurality of electrodes and wirings as well as elements are provided on a transparent insulating substrate. Specifically, switching elements such as thin film transistors (TFTs) each having a scanning line and a signal line as well as a gate electrode and source/drain electrodes are arranged in an array. Further, an independent video signal is applied to an electrode of each display pixel.

The manufacturing of this active matrix type TFT array substrate requires a number of processes. Therefore, there have been problems in the productivity including increase in the number of manufacturing devices and increase in the failure occurrence rate. Conventionally, manufacturing methods in which five photolithography processes are carried out (hereinafter called "five-mask process") have been commonly used (see, for example, Japanese Unexamined Patent Application Publication No. 11-242241).

Meanwhile, in recent years, a method in which middle-tone exposure is applied in the back channel regions of TFTs has been known as a technique for reducing the number of masks used to form a thin film transistor substrate (see, for example, Japanese Unexamined Patent Application Publication No. 2000-164886). This method is called "four-mask process". Since the four-mask process can reduce the number of necessary masks, it is considered to be a promising technique for reducing manufacturing costs. As described above, technological development for making the four-mask process fit for practical use has been in progress.

Referring to FIGS. 13 and 14, an example of a method of manufacturing an inverted staggered TFT using the four-mask process and a structure of such a TFT is explained hereinafter. FIG. 13 is a plane view illustrating a structure of a TFT. FIG. 14 is a cross sectional view taken along the line XIV-XIV in FIG. 13.

Firstly, a gate electrode 2 is formed on the insulating substrate 1. Next, a gate insulating film 3, an intrinsic semiconductor film 4, an impurity semiconductor film 5, and a conductive film for a source line are formed in succession. Then, a resist is applied on the conductive film for a source line. After that, middle-tone exposure is performed on the resist located over the back channel formation region of a TFT. In this way, a resist having two different film-thicknesses is formed. Specifically, the resist has a thicker film-thickness in the source/drain formation regions and a thinner film-thickness in the back channel formation region.

By using this resist as a mask, the conductive film for a source line, the impurity semiconductor film 5, and the intrinsic semiconductor film 4 are successively etched. Next, the resist having the thinner film-thickness is removed, so that the conductive film for a source line located over the back channel formation region is exposed. After that, by using the remaining resist as a mask, the conductive film for a source line is etched. In this way, the conductive film for a source line is patterned into a desired shape, and thereby a source line 9, a source electrode 6, and a drain electrode 7 are formed. In the following explanation, the conductive film for a source line after the patterning is referred to as "conductive film 25". Then, by using the remaining resist as a mask, the impurity semiconductor film 5 is etched. In this way, a back channel region 8 is formed, and the manufacturing of the TFT has been completed. Since the semiconductor film and the conductive film for a source line are formed by a single photolithography process in this manner, it is possible to reduce the number of necessary masks.

For example, in the case of a liquid crystal display device, the development of a technique for simultaneously incorporating a circuit for increasing additional value, in addition to the image displaying function, into a TFT array substrate having TFTs formed in this manner has been also in progress. Therefore, in such a TFT array substrate, the source line 9 is used not only as a line to transmit display signals but also to form a circuit for incorporating an additional function. In such a case, the source line 9 could become longer, and the number of TFT formation places per one source line 9 could be restricted.

When the number of TFT formation places for one source line 9 is too small, the metal film cannot be completely removed by etching during the formation of the back channel region 8. That is, the metal film cannot be completely removed, and could remains above the back channel region 8 in such a manner that the source electrode and the drain electrode are short-circuited, and thus causing a failure that the TFT is not formed. As a result, a part of the circuit does not operate properly, and thus reducing the yields of the products.

In an exemplary aspect, the present invention has been made in view of the above-mentioned problems, and an exemplary object of the present invention is to provide a method of manufacturing a TFT substrate and a TFT substrate capable of improving the yields and thus improving the productivity.

SUMMARY OF THE INVENTION

In an exemplary aspect of the present invention, a method of manufacturing a TFT substrate having a TFT includes steps of: forming an intrinsic semiconductor film, an impurity semiconductor film, and a conductive film for a source line in succession; forming a resist having a thin-film portion and a thick-film portion on the conductive film for a source line; etching the conductive film for a source line, the impurity semiconductor film, and the intrinsic semiconductor film by using the resist as a mask; exposing a part of the conductive film for a source line by removing the thin-film portion of the resist; exposing the impurity semiconductor film by etching the exposed conductive film for a source line with the thick-film portion of the resist used as a mask; and forming a back channel region of the TFT and a dummy back channel region by etching the exposed impurity semiconductor film, the dummy back channel region being formed in a portion other than the TFT region and being irrelevant to the operation of a finished product.

In an exemplary aspect of the present invention, a TFT substrate having a TFT includes: a semiconductor film including an intrinsic semiconductor film and an impurity semiconductor film, and having a back channel region of the TFT where the impurity semiconductor film on the intrinsic semiconductor film is removed; a conductive film for a source line formed on the semiconductor film, formed inside the semiconductor film, and including a source line configured to supply a source signal to the TFT; and a dummy back channel region located in a portion other than the TFT region and being irrelevant to the operation of a finished product. Over the dummy back channel region, the conductive film for a source line on the semiconductor film is removed.

The present invention can provide a method of manufacturing a TFT substrate and a TFT substrate capable of improving the yields and thus improving the productivity.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

First Exemplary Embodiment

Figure 1:
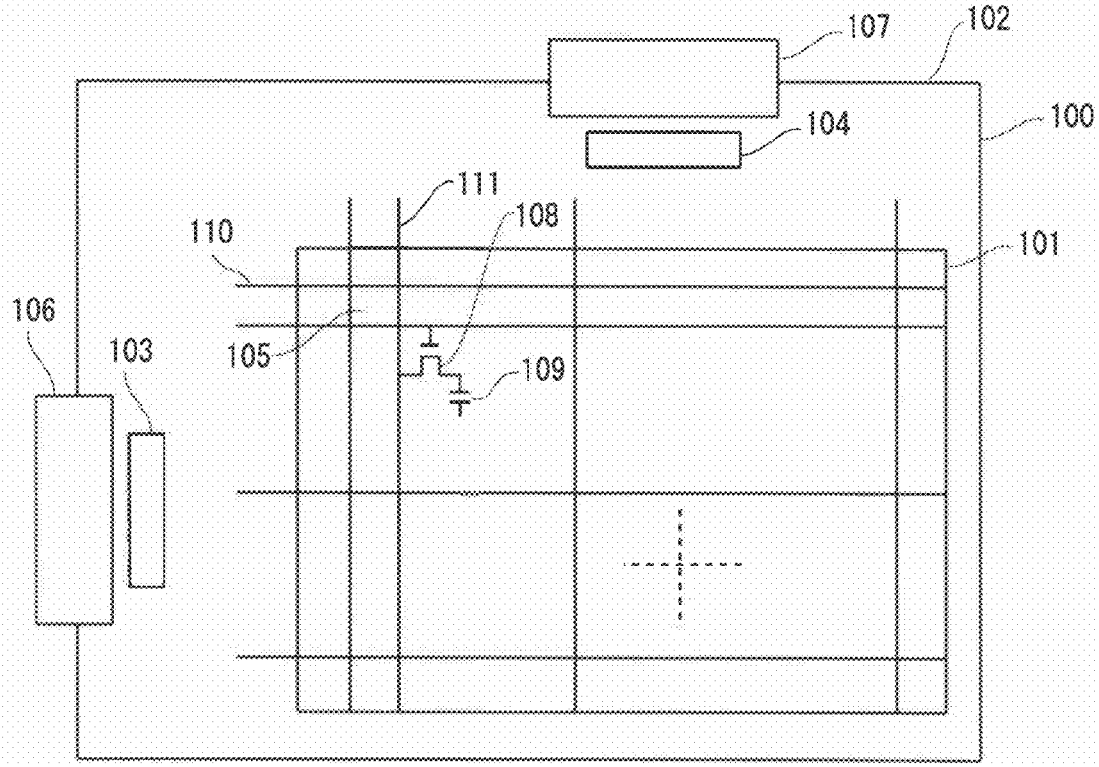
FIG. 1 is a plane view illustrating a structure of a TFT substrate for use in a display device in accordance with a first exemplary embodiment of the present invention.

Firstly, a TFT substrate in accordance with a first exemplary embodiment of the present invention is explained hereinafter with reference to FIG. 1. FIG. 1 is a plane view illustrating a structure of a TFT substrate. The TFT substrate can be used for a flat-type display device (flat panel display) such as a liquid crystal display device and an organic EL display device.

A TFT substrate 100 is, for example, a TFT array substrate where thin film transistors (hereinafter referred to as TFT) 108 are arranged in array. The TFT substrate 100 has a display region 101 and a frame region 102 surrounding the display region 101. In the display region 101, a plurality of gate lines (scanning signal lines) 110, a plurality of storage capacitance lines (not shown), and a plurality of source lines (display signal lines) 111 are formed. The plurality of gate lines 110 and the plurality of storage capacitance lines are arranged in parallel. Each of the storage capacitance lines is arranged between adjacent gate lines 110. In short, the gate lines 110 and the storage capacitance lines are alternately arranged.

The plurality of source lines 111 are arranged in parallel. The source lines 111 and the gate lines 110 are formed so as to cross each other. Likewise, the source lines 111 and the storage capacitance lines cross each other. The gate lines 110 and the source lines 111 are orthogonal to each other. Likewise, the storage capacitance lines and the source lines 111 are orthogonal to each other. Then, a region surrounded by the adjacent gate lines 110 and the adjacent source lines 111 is a pixel 105. That is, the storage capacitance line is formed so as to traverse the pixels 105. The pixels 105 are arranged in matrix in the TFT substrate 100.

Further, the frame region 102 of the TFT substrate 100 includes a scanning signal driving circuit 103 and a display signal driving circuit 104. The gate line 110 extends from the display region 101 to the frame region 102. Then, the gate line 110 is connected with the scanning signal driving circuit 103 at the edge of the TFT substrate 100. The source line 111 similarly extends from the display region 101 to the frame region 102. Then, the source line 111 is connected to the display signal driving circuit 104 at the edge of the TFT substrate 100. An external line 106 is connected near the scanning signal driving circuit 103. Further, an external line 107 is connected near the display signal driving circuit 104. The external lines 106 and 107 are constituted, for example, by a wiring board such as a FPC (Flexible Printed Circuit).

Various signals are externally supplied to the scanning signal driving circuit 103 and the display signal driving circuit 104 through the external lines 106 and 107. The scanning signal driving circuit 103 supplies a gate signal (scanning signal) to the gate lines 110 in accordance with an external control signal. The gate lines 110 are successively selected in accordance with the gate signal. The display signal driving circuit 104 supplies a display signal to the source lines 111 in accordance with the external control signal or display data. As a result, the display voltage corresponding to the display data can be applied to each pixel 105. Incidentally, the scanning signal driving circuit 103 and the display signal driving circuit 104 are not limited to the above structure where the circuits are formed on the TFT substrate 100. For example, driving circuits may be connected by a TCP (Tape Carrier Package).

In each pixel 105, at least one TFT 108 and a storage capacity 109 connected to the TFT 108 are formed. The TFT 108 is arranged in the vicinity of an intersection of the source line 111 with the gate line 110. For example, this TFT 108 serves as a switching element to supply a display voltage to a pixel electrode. The gate electrode of the TFT 108 is connected to the gate line 110, and the TFT 108 is controlled so as to turn ON/OFF in accordance with a gate signal input from a gate terminal. The source electrode of the TFT 108 is connected to the source line 111. When a voltage is applied to the gate electrode and the TFT 108 is turned on, a current flows from the source line 111. Thus, a display voltage is applied from the source line 111 to the pixel electrode connected to the drain electrode of the TFT 108. Then, an electric field corresponding to the display voltage is generated between the pixel electrode and an opposing electrode.

The storage capacity 109 is a capacity that is formed so as to sandwich an interlayer insulating film interposed between the pixel electrode and the storage capacitance line, and the gate insulating film. In addition to this, the storage capacitance line is also electrically connected to the opposing electrode, so that the storage capacity 109 is also connected in parallel with the capacitance between the pixel electrode and the opposing electrode.

Further, in the liquid crystal display device, an opposing substrate is arranged opposite to the TFT substrate 100. The opposing substrate is, for example, a color filter substrate and is placed on the display screen side. On the opposing substrate, a color filter, a black matrix (BM), an opposing electrode, an alignment layer and the like are formed. Incidentally, the opposing electrode is placed on the TFT substrate 100 side, for example, in an IPS-mode liquid crystal display device. Then, a liquid crystal layer is interposed between the TFT substrate 100 and the opposing substrate. That is, liquid crystal is filled between the TFT substrate 100 and the opposing substrate. Further, a polarizing plate, a retardation film and the like are placed on the outer surfaces of the TFT substrate 100 and the opposing substrate. Further, a backlight unit or the like is arranged on the opposite side to the display screen of the liquid crystal display panel formed in a manner described above.

The liquid crystals are driven by an electric field generated between the pixel electrode and the opposing electrode. That is, an orientation direction of the liquid crystals between the substrates is changed. As a result, a polarization state of light transmitted through the liquid crystal layer is changed. That is, the polarization state of the light that was turned into linearly-polarized light through the polarizing plate is changed by the liquid crystal layer. More specifically, light from the backlight unit and external light that is externally entered are turned into linearly-polarized light by the polarizing plate on the TFT substrate 100 side. Then, the polarization state is changed as this linearly-polarized light passes through the liquid crystal layer.

Accordingly, an amount of light transmitted through the polarizing plate on the opposing substrate side varies depending on the polarization state. That is, among the transmitted light that transmits through the liquid crystal display panel from the backlight unit, the amount of the light that passes through the polarizing plate on the display screen side varies. The orientation direction of the liquid crystals varies depending on the applied display voltage. Therefore, the amount of the light that passes through the polarizing plate on the display screen side can be changed by controlling the display voltage. That is, a desired image can be displayed by varying the display voltage on a pixel-by-pixel basis. Incidentally, with a series of these operations, the electric field is formed in the storage capacity 109 in parallel with the electric field between the pixel electrode and the opposing electrode, which contributes to the retention of the display voltage.

Figure 2:
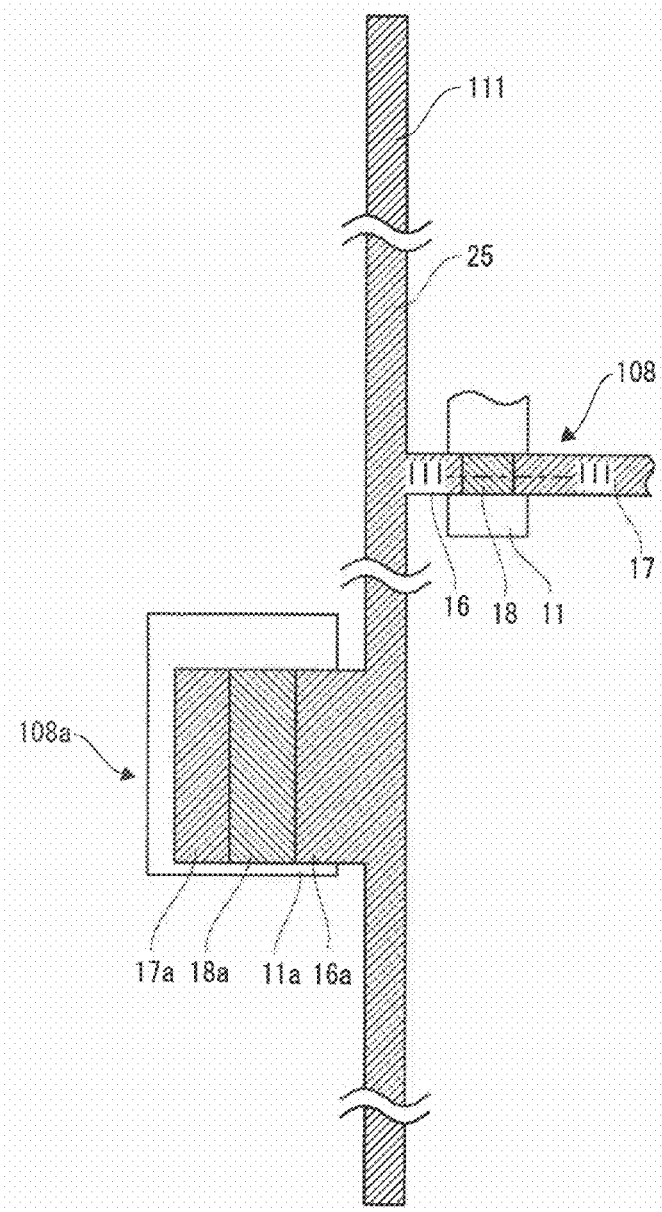
FIG. 2 is a plane view illustrating a structure of one source line in accordance with the first exemplary embodiment of the present invention.
Figure 3:
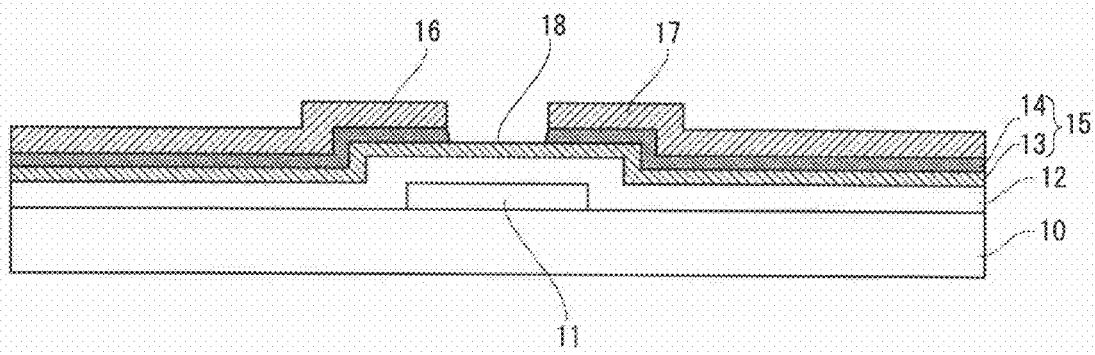
FIG. 3 is a cross sectional view taken along the line III-III in FIG. 2.

Next, a structure of one source line 111 to which a TFT 108 is connected is explained hereinafter with reference to FIGS. 2 and 3. FIG. 2 is a plane view illustrating a structure of one source line 111. FIG. 3 is a cross sectional view taken along the line III-III in FIG. 2. That is, FIG. 3 is a cross sectional view illustrating a structure of a TFT 108 serving as a switching element. In this example, a MOS type TFT is explained.

As shown in FIG. 2, the TFT substrate 100 includes linearly-formed source lines 111. As a result of patterning performed on the conductive film for source lines 20 by using a well-known photolithography process and an etching method, the conductive film 25 forms source lines 111, source electrodes 16, drain electrodes 17, dummy source electrodes 16*a*, and dummy drain electrodes 17*a*. In this exemplary embodiment of the present invention, an example where a TFT 108 and a dummy TFT 108*a* are connected to a source line 111 in the TFT substrate 100 is shown. It should be noted that while the TFT 108 functions as a switching element, the dummy TFT 108*a* does not function as a switching element. That is, the dummy TFT 108*a* does not electrically operate. In FIG. 2, the TFT 108 and the dummy TFT 108*a* are formed on the right and left sides respectively of the source line 111 extending in the longitudinal direction.

In order to apply the four-mask process, a semiconductor film 15 is also patterned, under the conductive film 25, into a shape conforming to the planar shape of the conductive film 25. That is, the conductive film 25 is formed so as not to stick out planarly from the semiconductor film 15. In other words, the conductive film 25 is formed inside the pattern of the semiconductor film 15. Furthermore, in the back channel region 18, only the intrinsic semiconductor film 13 is left as a region where the channel of a MOS transistor is formed.

Firstly, a structure of the TFT 108 is explained. As shown in FIG. 3, a gate electrode 11 is formed on a transparent insulating substrate 10 composed of glass or the like. The gate electrode 11 is a part of the gate line 110. The gate line 110 extends across a plurality of pixels 105 and supplies a gate signal to the gate electrode 11 of each of those pixels 105. Then, a gate insulating film 12 is formed so as to cover the gate electrode 11.

The semiconductor film 15 is formed on the gate insulating film 12. The semiconductor film 15 has a structure in which the intrinsic semiconductor film 13 and the impurity semiconductor film 14 are stacked on top of the other. The intrinsic semiconductor film 13 is an intrinsic semiconductor film containing no conductive impurities, and the impurity semiconductor film 14 is a semiconductor film containing conductive impurities. For example, an n-type semiconductor film doped with a very small quantity of phosphorus (P) as impurity elements may be used as the impurity semiconductor film 14. The semiconductor film 15 has roughly the same planar shape as the conductive film 25. In the region where the TFT 108 is to be formed, the back channel region 18 is formed by removing a portion of the impurity semiconductor film 14 and the conductive film for a source line 20 located roughly in the center of the gate electrode 11.

The impurity semiconductor film 14 is formed on both sides across the back channel region 18, and one piece of the impurity semiconductor film 14 constitutes a drain region and the other piece constitutes a source region. Note that the back channel region 18 serves as the region where a channel is formed when a gate voltage is applied to the gate electrode 11. In this way, when a gate voltage is applied to the gate electrode 11, a channel is formed in the back channel region 18 in the vicinity of the gate insulating film 12. Then, when a predefined potential difference is applied between the source and drain regions, a drain current flows between the source region and the drain region according to the gate voltage.

The conductive film 25 is formed on the impurity semiconductor film 14. The impurity semiconductor film 14 and the conductive film 25 are in contact with each other. The source line 111 is formed so as not to stick out planarly from the semiconductor film 15, more precisely from the impurity semiconductor film 14. A portion of the source line 111 that contacts with the source region is referred to as "source electrode 16", and a portion that contacts with the drain region is referred to as "drain electrode 17". The source line 111 extends across a plurality of pixels 105 and supplies a source signal to the source electrode 16 of each of those pixels 105.

Next, a structure of the dummy TFT 108a is explained. The dummy TFT 108a has substantially the same cross-sectional structure as that of the TFT 108 shown in FIG. 3. Therefore, explanation for parts that are common to those of the TFT 108 is omitted. Furthermore, the dummy TFT 108a is formed in a larger size than the TFT 108. The dummy gate electrode 11a of the dummy TFT 108a does not contact with other electrodes and the like. However, the dummy gate electrode 11a may be connected, for example, with a storage capacitance line (Cs common capacitance line), as long as the dummy TFT 108a is irrelevant to the circuit operation. The dummy source electrode 16a is a part of the gate line 111.

A dummy drain electrode 17a is formed on the opposite side to the dummy source electrode 16a across the dummy back channel region 18a. The dummy back channel region 18a is irrelevant to the driving of any TFT 108 formed in the TFT substrate 100. That is, the dummy back channel region 18a is irrelevant to the operation of the finished product. Therefore, the dummy back channel region 18a does not operate by the gate signal or the source signal for the displaying operation. The dummy back channel region 18a has substantially the same structure as that of the back channel region 18 of the TFT 108. In other words, the dummy back channel region 18a is a region which is located in a portion other than the TFT 108 region and in which the conductive film for source lines 20 over the semiconductor film 15 is etched. The dummy drain electrode 17a is not connected with any circuit in the display device. The dummy TFT 108a has a structure described above.

In the case of a TFT substrate 100 for a liquid crystal display device, the interlayer insulating film (not shown) is formed so as to cover these elements. Furthermore, the pixel electrode (not shown) is formed in a predefined place on the interlayer insulating film and connected to the drain electrode 17 through a contact hole formed in the interlayer insulating film.

When an area over one independent pattern of the semiconductor film 15, more precisely over one independent pattern of the intrinsic semiconductor film 13, where the conductive film for source lines 20 is to be etched and which corresponds to the back channel region 18 is defined to be 1, the area of the conductive film for source lines 20 (conductive film 25) that is left un-etched after the etching is defined as an area ratio R. In this exemplary embodiment of the present invention, if the area ratio R exceeds 100 without forming any back channel region 18, it is preferable to reduce the area ratio R to a value equal to or less than 100 by forming a dummy back channel region(s) 18a. Note that the area ratio R is always larger than zero.

Explanation is made by taking the example shown in FIG. 2 as an example. When no dummy TFT 108a is formed for one independent source line 111, the area of the conductive film 25 becomes the area ratio R on the assumption that the area of the back channel region 18 of a TFT 108 (in the case where a plurality of TFTs 108 are connected to one independent source line 111, an aggregate of the back channels of all the TFTs 108) is defined to be 1. Then, if the area ratio R exceeds 100, a dummy TFT(s) 108a is formed so that the area ratio R becomes equal to or less than 100. Furthermore, even in the case where no dummy TFT 108a is formed, if the area ratio R is equal to or less than 100, it is unnecessary to form a dummy TFT 108a.

Note that there is no restriction on the size and the number of dummy TFTs 108. Therefore, it is also possible to form more than one dummy TFT 108a for one source line 111. In such a case, plural dummy back channel regions 18a of those plural dummy TFTs 108a are summed up in the calculation for the area ratio R. Furthermore, the dummy pattern does not necessarily have to be the dummy TFT 108a having substantially the same structure as that of the TFT 108. The only requirement is that it should have a region where etching is performed just like the dummy back channel region 18a, and other structures and elements can be omitted. For example, the dummy gate electrode 11a can be omitted.

Figure 4:
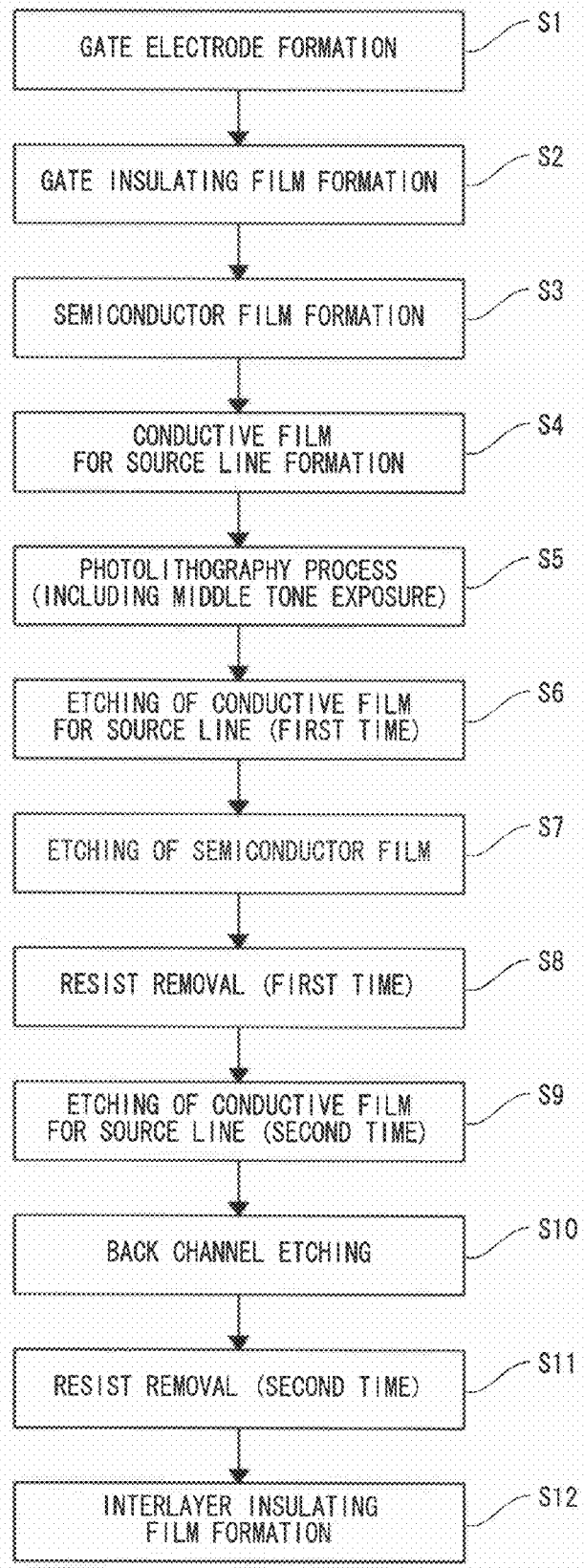
FIG. 4 is a flowchart illustrating a method of manufacturing the TFT substrate in accordance with the first exemplary embodiment of the present invention.

Next, a manufacturing method of the TFT substrate 100 is explained with reference to FIGS. 4 and 5A to 5G. FIG. 4 is a flowchart illustrating a method of manufacturing the TFT substrate 100. FIGS. 5A to 5G are cross sectional views for illustrating a method of manufacturing the TFT substrate 100. In this example, a method of manufacturing the TFT substrate 100 using a four-mask process is explained. Furthermore, the dummy TFT 108a is formed by the one and same process as the TFT 108.

Firstly, gate electrodes 11 and gate lines 110 are formed on the insulating substrate 10 (step S1). Specifically, a conductive film for gate lines is formed on an optically-transparent insulating substrate such as a glass substrate and a quartz substrate by using a DC magnetron sputtering method or the like. For example, a metal film such as chromium, molybdenum, tantalum, titanium, aluminum, and copper, and an alloy film created by adding a very small quantity of other substances to these metals, and a stacked film of these films may be used as the conductive film for gate lines.

Then, a resist (photoresist), which is photosensitive resin, is applied on the conductive film for gate lines by a spin-coat method. Further, a well-known a photolithography process including exposure and development is performed on the applied resist. In this way, the resist is patterned into a desired shape. After that, by using the resist pattern as a mask, the conductive film for gate lines is etched and patterned into a desired shape. After that, the resist is removed. In this way, gate electrodes 11 and gate lines 110 are formed. Note that the edge of each gate electrode 11 is preferably formed into a tapered shape. By forming the edge into a tapered shape, the coating property of the gate insulating film 12, which is formed later, is improved. Further, it provides another advantageous effect that the withstand voltage of the insulating film is also improved. With processes described above, a structure shown in FIG. 5A is obtained.

Next, a gate insulating film 12 is formed over the formed gate electrodes 11 and gate lines 110 by using a plasma CVD method (step S2). For example, a silicon nitride film (SiN film) or a silicon oxide film (SiO film) can be used as the gate insulating film 12. After that, a semiconductor film 15 is formed on the gate insulating film 12 by using a plasma CVD method or the like (step S3). Specifically, an intrinsic semiconductor film 13 and an impurity semiconductor film 14 are formed in succession on the gate insulating film 12. An amorphous silicon (a-Si) film or a polysilicon (p-Si) film may be used as the intrinsic semiconductor film 13. An n-a-Si film or an n-p-Si film, which is created by doping a-Si or p-Si with a very small quantity of phosphorus (P), may be used as the impurity semiconductor film 14.

Next, a conductive film for a source line 20, which is used to form source/drain electrodes 16 and 17, is formed on the impurity semiconductor film 14 by using a DC magnetron sputtering method or the like (step S4). Similarly to the conductive film for gate lines, various metal films and alloy films can be used as the conductive film for source lines 20. Note that a cleaning process may be carried out before a film is formed from different material. With processes described above, a structure shown in FIG. 5B is obtained.

Figure 5A:
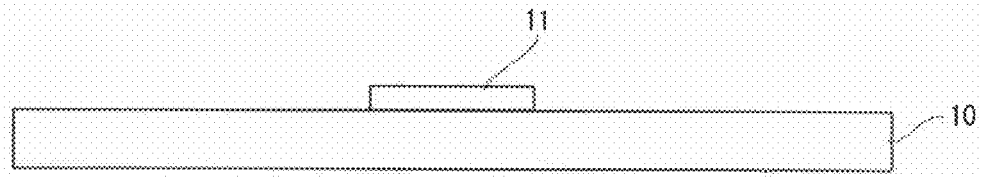
FIGS. 5A to 5G are cross sectional views for illustrating a method of manufacturing the TFT substrate in accordance with the first exemplary embodiment of the present invention.
Figure 5B:
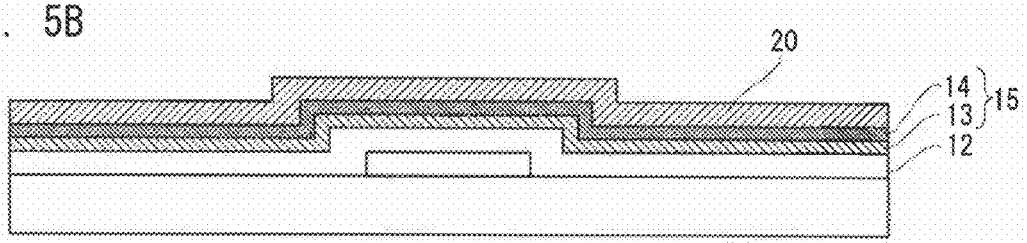
Figure 5C:
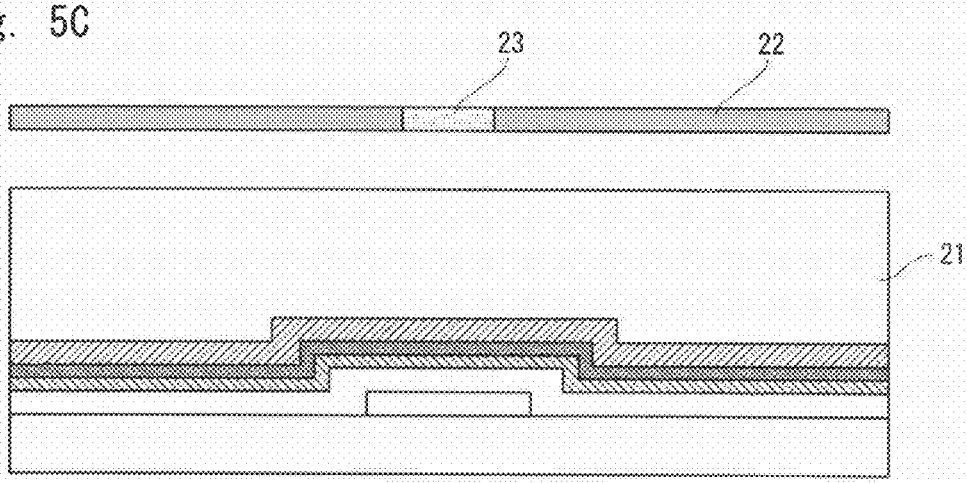
Figure 5D:
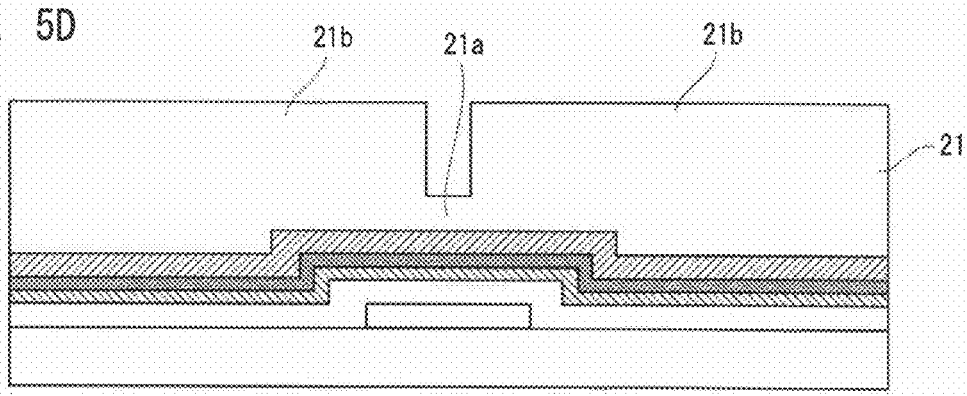
Figure 5E:
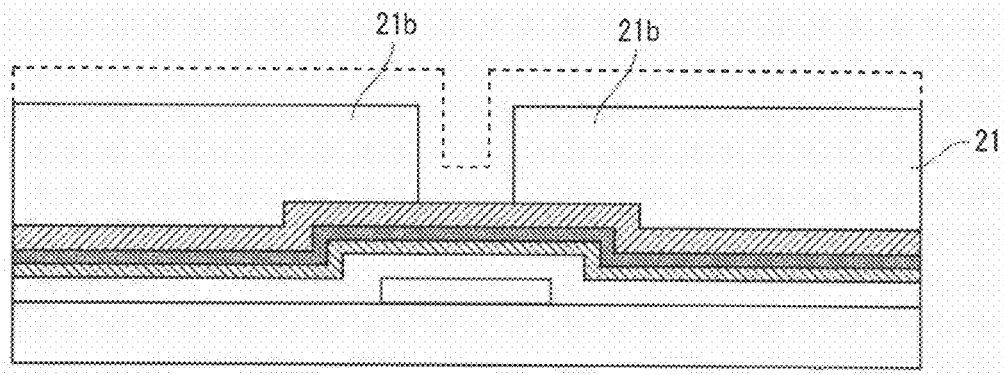

Next, a resist pattern is formed on the conductive film for source lines 20 by a well-known photolithography process (step S5). Firstly, a resist 21 is applied on the conductive film for source lines 20. Then, as shown in FIG. 5C, the resist 21 is exposed through a mask 22 having a middle-tone exposure portion 23 which enables to expose in middle tone. In this example, an example where a positive type resist is used as the resist 21 is explained.

The middle-tone exposure portion 23 of the mask 22 is disposed over the back channel region 18. Then, the resist 21 is exposed through this mask 22, and thereby portions of the resist 21 that are located above the source/drain formation regions (regions that become the source/drain regions in a later process) are left unexposed. Further, a portion of resist 21 that is located above the back channel formation region (region that becomes the back channel region 18 in a later process) is exposed in middle tone. Further, the remaining portions of the resist 21 other than these regions are completely exposed. That is, the degree of exposure in the back channel formation region of the resist 21 is higher than that in the source/drain regions of the resist 21. Furthermore, the degree of exposure in the back channel formation region of the resist 21 is lower than that in the remaining regions of the resist 21.

As described above, the exposure is performed, for example, by using a mask 22 having regions each having one of at least two different levels according to which an amount of transmitted light is changed, so that the degree of exposure is adjusted on a region-by-region basis. The middle-tone exposure portion 23 may be formed, for example, from material having a certain transmittance. That is, a halftone mask can be used as the mask 22. Alternatively, the middle-tone exposure portion 23 maybe formed by using the shielding pattern for forming unexposed portions which is disposed finer than the limit of resolution in a slit-like or a mesh-like pattern to have a certain transmittance. That is, a gray-tone mask can be use as the mask 22. In this way, since both the semiconductor film 15 and the conductive film for source lines 20 can be etched in a single exposure, the number of photolithography processes can be reduce by one.

After that, the resist 21 is patterned into a desired planar shape by development. At this point, the portion of the resist 21 that is located over the back channel formation region of the TFT 108 remains with a thickness thinner than that of the unexposed portions of the resist 21. That is, the resist 21 is formed thinner over the back channel formation region, and formed thicker over the source/drain formation regions. In other words, a thin-film portion 21a of the resist 21 is formed over the back channel formation region, and thick-film portions 21b of the resist 21 are formed over the source/drain formation regions. Furthermore, no resist 21 is formed in the other regions. Note that since the dummy gate electrode 11a is formed in each dummy TFT 108a in this exemplary embodiment of the present invention, the resist film-thickness can be made uniform between the back channel formation region and the dummy back channel formation region. With processes described above, a structure shown in FIG. 5D is obtained.

After that, etching (first etching) of the conductive film for source lines 20 is performed by using the resist 21 as a mask (step S6). Next, etching of the semiconductor film 15 is performed (step S7). In this way, portions of the conductive film for source lines 20 and the semiconductor film 15 where the resist 21 was completely exposed and removed are removed.

Further, a plurality of separated patterns are formed. Since a plurality of films are etched in succession by using a single mask, a structure in which the conductive film 25 is stacked on the semiconductor film 15 having substantially the same planar shape as the planer shape of the conductive film 25 is obtained for each pattern.

Next, removal (first removal) of the resist 21 is carried out (step S8). At this time, the resist 21 is removed by a thickness corresponding to the thickness of the thinner resist 21 over the back channel formation region of the TFT 108 by ashing or the like. That is, the thin-film portion 21a of the resist 21 formed over the back channel formation region is removed. Furthermore, although the thick-film portions 21b of the resist 21 are reduced in thickness, they still remain as patterns. In this way, a portion of the conductive film for source lines 20 is exposed. That is, the portion of the conductive film for source lines 20 that located over the back channel formation region is exposed, and the remaining portions are left covered with the resist 21. With processes described above, a structure shown in FIG. 5E is obtained.

Figure 5F:
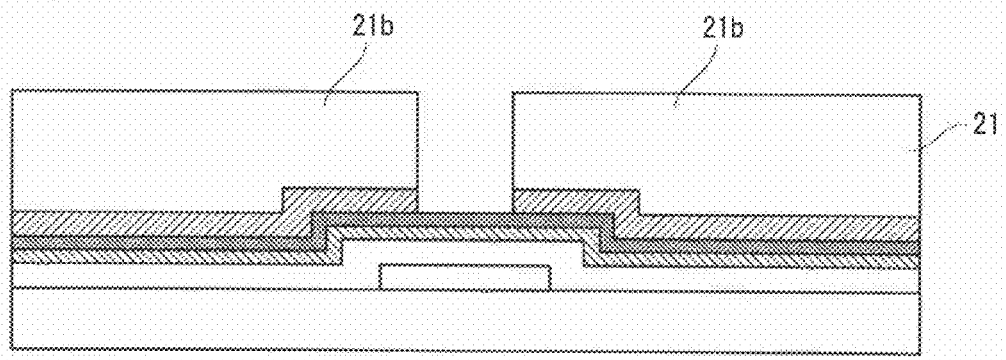
Figure 5G:
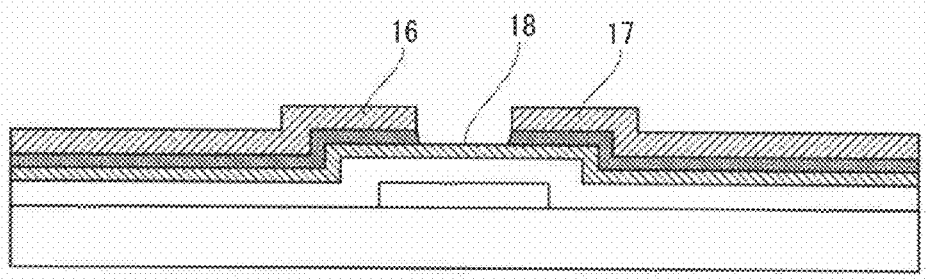

Next, etching (second etching) of the conductive film for source lines 20 is performed by using the remaining resist 21 as a mask (step S9). That is, etching of the conductive film for source lines 20 exposed by the above-described process is performed by using the thick-film portions 21b of the resist 21. At this time, wet-etching is performed as the etching. With processes described above, the impurity semiconductor film 14 located over the back channel formation region is exposed and thereby a structure shown in FIG. 5F is obtained.

In this exemplary embodiment of the present invention, the dummy back channel region 18a is also simultaneously formed in the same processes. When attention is focused on one certain conductive film for a source line 20 to which a dummy TFT 108a is added, the area of the conductive film for a source line 20 that is etched in the step S9 is larger than that in the case where no dummy TFT 108a is added to the conductive film for a source line 20. That is, the area ratio R becomes smaller in comparison to the case where no dummy TFT 108a is added. As a result, residual formation in the etching in the back channel region 18 is suppressed. The area ratio R is preferably made equal to or less than 100.

Next, back channel etching is performed (step S10). At this time, the exposed impurity semiconductor film 14 is etched, so that the source electrode 16 and the drain electrode 17 can function as the respective electrodes. At this point, a portion of the intrinsic semiconductor film 13 in the back channel region 18 may be also etched. That is, the film-thickness of the intrinsic semiconductor film 13 located in the back channel region 18 may become thinner than that of the intrinsic semiconductor film 13 located in the source/drain regions.

Next, removal (second removal) of the resist 21 is carried out (step S11). The remaining resist 21 is entirely removed in this process. In this way, a source line 111, a source electrode 16, a drain electrode 17, and a back channel region 18 are formed. Then, the manufacturing of the TFT 108 has been completed with a structure shown in FIG. 5G. By incorporating a mask pattern for the dummy TFT 108a in the mask for a photolithography process used in the step S5, the dummy TFT 108a can be simultaneously formed through the processes of the steps S1 to S11.

After that, an interlayer insulating film is formed so as to cover the source/drain electrodes 16 and 17 by using a plasma CVD method or the like (step S12). An S10 film or an SiN film can be used as the interlayer insulating film. Then, the interlayer insulating film and the gate insulating film 12 are shaped into desired patterns by using a well-known photolithography process and an etching method. In this way, contact holes that are used to connect pixel electrodes or the likes to the gate lines 110 or source lines 111 are formed.

Next, a conductive film for pixel electrodes is formed on the interlayer insulating film by a sputtering method using a DC magnetron or the like. A transparent conductive film such as ITO and IZO can be used as the conductive film for pixel electrodes. Then, the conductive film for pixel electrodes is shaped into a desired pattern by using a well-known photolithography process and an etching method. In this way, conductive film patterns and pixel electrodes that are connected to the gate lines 110 or the source lines 111 through contact holes are formed as necessary. With processes described above, the TFT substrate 100 is formed.

As has been described above, since dummy back channel regions 18a are formed in this exemplary embodiment of the present invention, the area of the wet-etching performed in the step S9 becomes larger. When doing so, the area that is left un-etched is preferably made equal to or less than 100 on the assumption that the area to be etched for one conductive film for a source line 20 is defined to be 1. That is, the area ratio R is preferably equal to or less than 100. By reducing the area ratio R in this manner, no residual formation occurs on the back channel region 18. Therefore, the occurrence of failures in TFTs 108 is prevented. Further, the yields are improved and thus the productivity is improved.

Furthermore, since dummy back channel regions 18a are formed in this exemplary embodiment of the present invention, the residual formation on the back channel region 18 is eliminated even when the number of TFTs 108 added for one source line 111 is small, and thus improving the degree of flexibility in the length and size of the source line 111. Therefore, it becomes possible to mount a circuit for increasing additional value as a display device in the TFT substrate 100. Accordingly, it provides an advantageous effect of improving the functions as a product.

For example, when a large storage capacitance is formed between the layer of the gate electrodes 11 and the layer of the source lines 111 or between the layer of the pixel electrodes and the layer of the source lines 111, the residual formation on the back channel region 18 can be suppressed by applying an exemplary aspect of the present invention even when TFTs are connected to these source lines 111, and thus enabling to manufacture a more sophisticated product. The formation of a storage capacitance requires a larger area and thus increasing the area ratio R, and an advantageous effect of the present invention will become more prominent in such a case.

Figure 6:
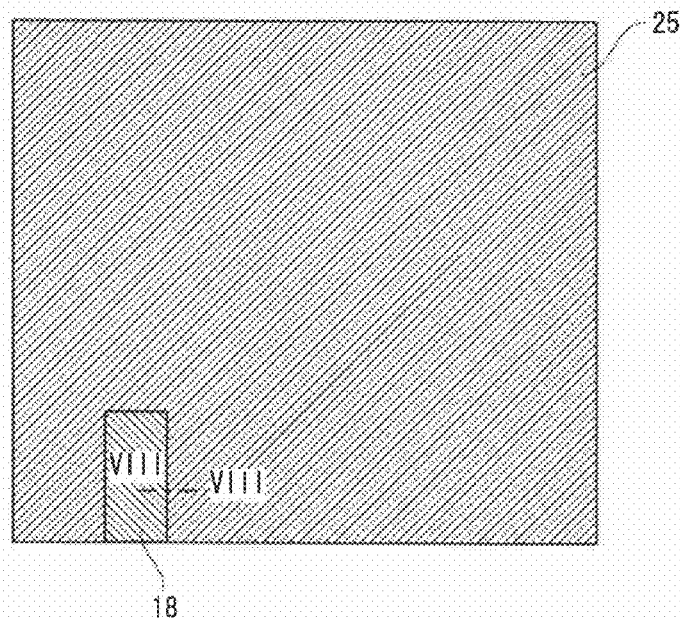
FIG. 6 is an explanatory diagram for an area ratio in accordance with the first exemplary embodiment of the present invention.

The area ratio R is explained hereinafter with reference to FIG. 6. FIG. 6 is an explanatory diagram for the area ratio R. The area ratio R is expressed by Equation 1 mentioned bellow. Note that in the equation, S is the area of the conductive film for source lines 20 (conductive film 25) that is left un-etched after the etching over the pattern of one independent semiconductor film 15, and T is the area of the region that is etched in the step S9 over the pattern of the independent semiconductor film 15. That is, S represents the area of the conductive film 25, and T represents the area of the back channel region 18 connected to this conductive film 25.

$R = S/T$ (Equation 1)

Firstly, an experimentation method is explained with reference to FIG. 6. The gate insulating film 12, the intrinsic semiconductor film 13, the impurity semiconductor film 14, and the conductive film for source lines 20 were formed in succession on substantially the entire surface of a substrate. Then, the conductive film for source lines 20 and the impurity semiconductor film 14 were etched and removed by using the above-described formation method for the back channel region 18. The area of the conductive film for source lines 20 that was left un-removed corresponds to the area S. The area where the conductive film for source lines 20 and the impurity semiconductor film 14 were removed corresponds to the area T. The region where they are removed corresponds to the back channel region 18. Then, the area where the conductive film for source lines 20 and the impurity semiconductor film 14 were removed, i.e., the area T was changed in order to change the area ratio R.

Figure 7:
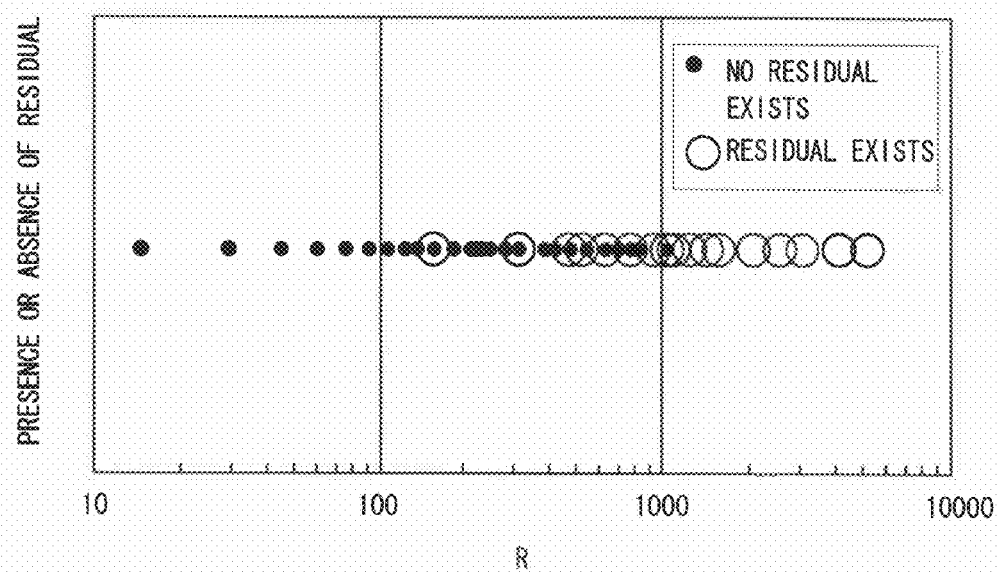
FIG. 7 is a correlation diagram showing results of the presence or absence of residual formation in regard to an area ratio R in accordance with the first exemplary embodiment of the present invention.

Next, result of the experiment is explained hereinafter. It was checked whether or not there was any residual film of the conductive film for source lines 20 on the back channel region 18 for each area ratio R. That is, it was checked whether or not there was any residual formation of the conductive film for source lines 20 on the back channel region 18. FIG. 7 shows results of the residual formation checks for those area rations R. In FIG. 7, the horizontal axis indicates the area ratio R. Further, patterns with which no residual formation occurred are represented by black circles, and patterns with which residual formation occurred are represented by white circles. As shown in FIG. 7, no residual formation occurred when the area ratio R is less than or equal to 100. Further, when the area ratio R is from 100 to 1000, patterns with which no residual formation occurred and patterns with which residual formation occurred were mixed. Furthermore, when the area ratio R is not less than 1000, residual formation occurred in almost all patterns.

That is, the residual formation occurrence rate of the conductive film for source lines 20 on the back channel region 18 in the step S9 increases with the increase in the area ratio R. The conductive film for source lines 20 is formed from, for example, a metal film. When the etching is carried out by wet-etching, the etching reaction proceeds through such a process that electrons are drawn from the metal by hydrogen ions contained in the chemical solution and thereby the metal is ionized and drawn into the chemical solution. However, in the case of the four-mask process, the semiconductor film 15 remains in the entire region that is covered by the conductive film for source lines 20. That is, the impurity semiconductor film 14, which is an n-type semiconductor film, is formed while contacting with the entire under-surface of the conductive film for source lines 20. Electrons, which are carriers of an n-type semiconductor film, affect the metal film when the electrons are drawn from the metal by hydrogen ions contained in the chemical solution. As a result, the electrical potential of the conductive film for source lines 20 in the chemical solution is lowered.

Figure 8:
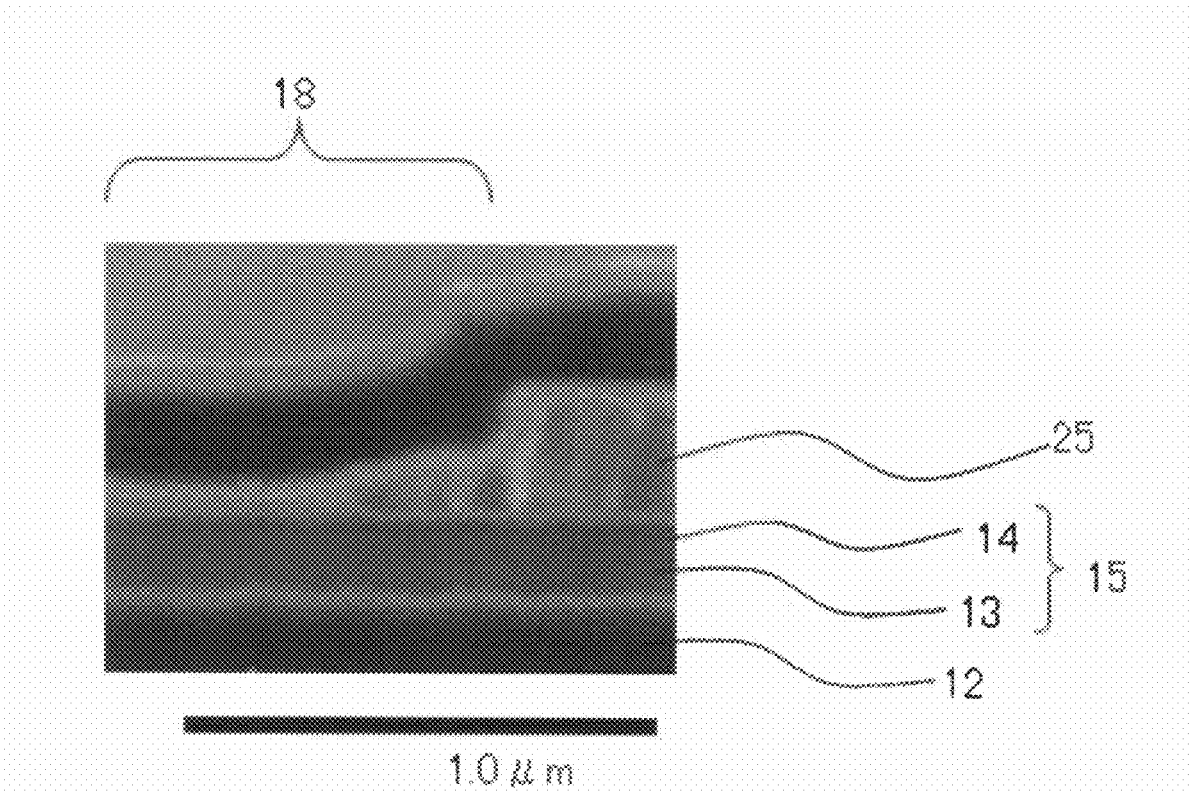
FIG. 8 is an actual photograph of a cross sectional view taken along the line VIII-VIII in FIG. 6, i.e., a pattern indicated by a white circle in FIG. 7.

As described above, the area that are left un-etched after the etching with respect to the whole area to be etched in the conductive film for source lines 20 increases with the increase in the area ratio R. That is, the area of the impurity semiconductor film 14 located under the conductive film for source lines 20 also increases. For example, assuming a comparison between a pattern of R=1000 and a pattern of R=10, both of which have the same size of area to be etched, the area of the impurity semiconductor film 14 in the pattern of R=1000 is 100 times larger than that of the pattern of R=10. That is, the pattern of R=1000 will be affected by 100 times larger number of electrons that are contained in the impurity semiconductor film 14 than that of the pattern of R=10. Therefore, the residual formation in etching tends to occur more often in a pattern having a larger area ratio R. FIG. 8 is an actual photograph of a cross sectional view taken along the line VIII-VIII in FIG. 6, i.e., a pattern indicated by a white circle in FIG. 7. As can been seen from FIG. 8, the conductive film for source lines 20 is left intact on the back channel region 18.

From these facts, the area ratio R should preferably have a smaller value, and in this exemplary embodiment of the present invention, the area ratio R is reduced by forming the dummy back channel region(s) 18a. Furthermore, as can be seen from FIG. 7, the area ratio R is preferably equal to or less than 100. In this way, the residual formation is eliminated on the back channel region 18. As a result, the occurrence of failures in TFTs 108 is prevented. For example, it can suppress such a situation that a portion of the conductive film for source lines 20 is left un-removed over the back channel region 18 and thus the source electrode 16 and the drain electrode 17 are short-circuited. That is, failures such as a malfunction in a part of the circuit are prevented. As a result, the yields can be improved.

Second Exemplary Embodiment

Figure 9:
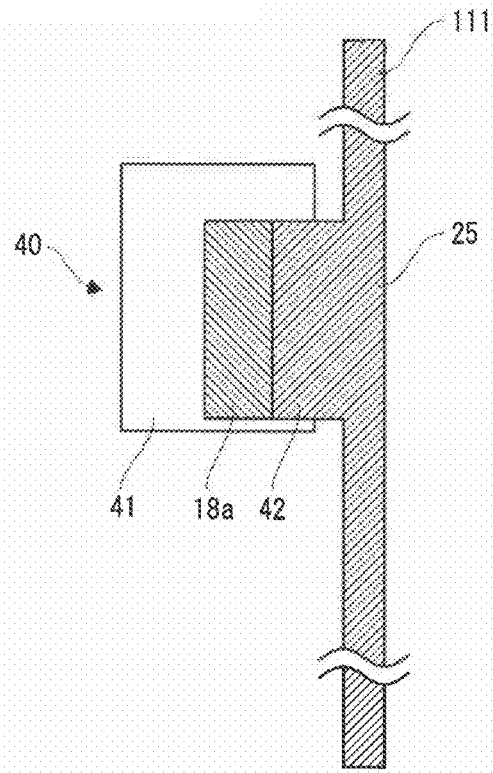
FIG. 9 is a plane view illustrating a structure of a dummy pattern in accordance with a second exemplary embodiment of the present invention.

A dummy pattern in accordance with a second exemplary embodiment of the present invention includes a first electrode, a second electrode, and a dummy back channel region. In other words, it has a similar structure to that of the dummy TFT 108a of the first exemplary embodiment of the present invention except that the dummy drain electrode 17a is omitted. Note that the other structures and manufacturing method and the like are the same as the first exemplary embodiment, and therefore explanation of them are omitted. The dummy pattern of this exemplary embodiment of the present invention is explained with reference to FIG. 9. FIG. 9 is a plane view illustrating a structure of a dummy pattern 40.

In this exemplary embodiment of the present invention, the dummy pattern 40 includes a first electrode 41 corresponding to the dummy gate electrode 11a of the first exemplary embodiment. Furthermore, the dummy pattern 40 also includes a second electrode 42 corresponding to the dummy source electrode 16a of the first exemplary embodiment. The second electrode 42 is formed from the conductive film 25. Furthermore, the semiconductor film 15 does not have any region corresponding to the dummy drain region of the dummy TFT 108a of the first exemplary embodiment.

This exemplary embodiment of the present invention can also achieve similar advantageous effects to those of the first exemplary embodiment. Furthermore, the conductive film 25 which corresponds to the dummy drain electrode 17a of the first exemplary embodiment is also omitted in this exemplary embodiment of the present invention. That is, any electrode irrelevant to the operation can be omitted unless it does not pose any problem in the manufacturing process. In this way, the area ratio R can be reduced more effectively in comparison to the first exemplary embodiment. Therefore, the size and number of the dummy patterns 40 can be reduced.

Third Exemplary Embodiment

Figure 10:
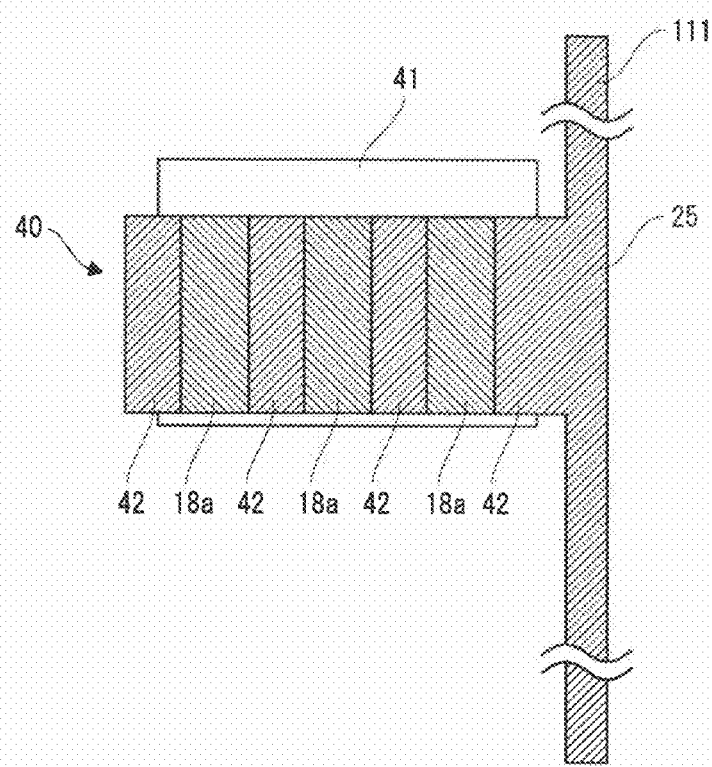
FIG. 10 is a plane view illustrating a structure of a dummy pattern in accordance with a third exemplary embodiment of the present invention.

In a third exemplary embodiment of the present invention, a plurality of patterns are connected to a dummy pattern. Note that the other structures and manufacturing method and the like are the same as the first exemplary embodiment, and therefore explanation of them are omitted. A dummy pattern 40 of this exemplary embodiment of the present invention is explained with reference to FIG. 10. FIG. 10 is a plane view illustrating a structure of the dummy pattern 40.

In this exemplary embodiment of the present invention, the dummy pattern 40 includes a first electrode 41 corresponding to the dummy gate electrode 11a of the first exemplary embodiment. Furthermore, the dummy pattern 40 also includes a plurality of second electrodes 42 corresponding to the dummy source electrode 16a and the dummy drain electrode 17a of the first exemplary embodiment. The plurality of second electrodes 42 are formed from the conductive film 25 so as not to stick out from the semiconductor film 15. Furthermore, the dummy pattern 40 includes a plurality of dummy back channel regions 18a. In this manner, a plurality of second electrodes 42 and a plurality of dummy back channel regions 18a are formed in a single dummy pattern 40. Further, the second electrodes 42 and the dummy back channel regions 18a are alternately arranged from the source line 111 side. In FIG. 10, four second electrodes 42 and three dummy back channel regions 18a are alternately arranged. Therefore, in order to calculate the area ratio R, the areas of these three dummy back channel regions 18a should be added to the area T. Furthermore, the areas of the four second electrodes 42 are added to the area S. This exemplary embodiment of the present invention can also achieve similar advantageous effects to those of the first exemplary embodiment.

Fourth Exemplary Embodiment

Figure 11:
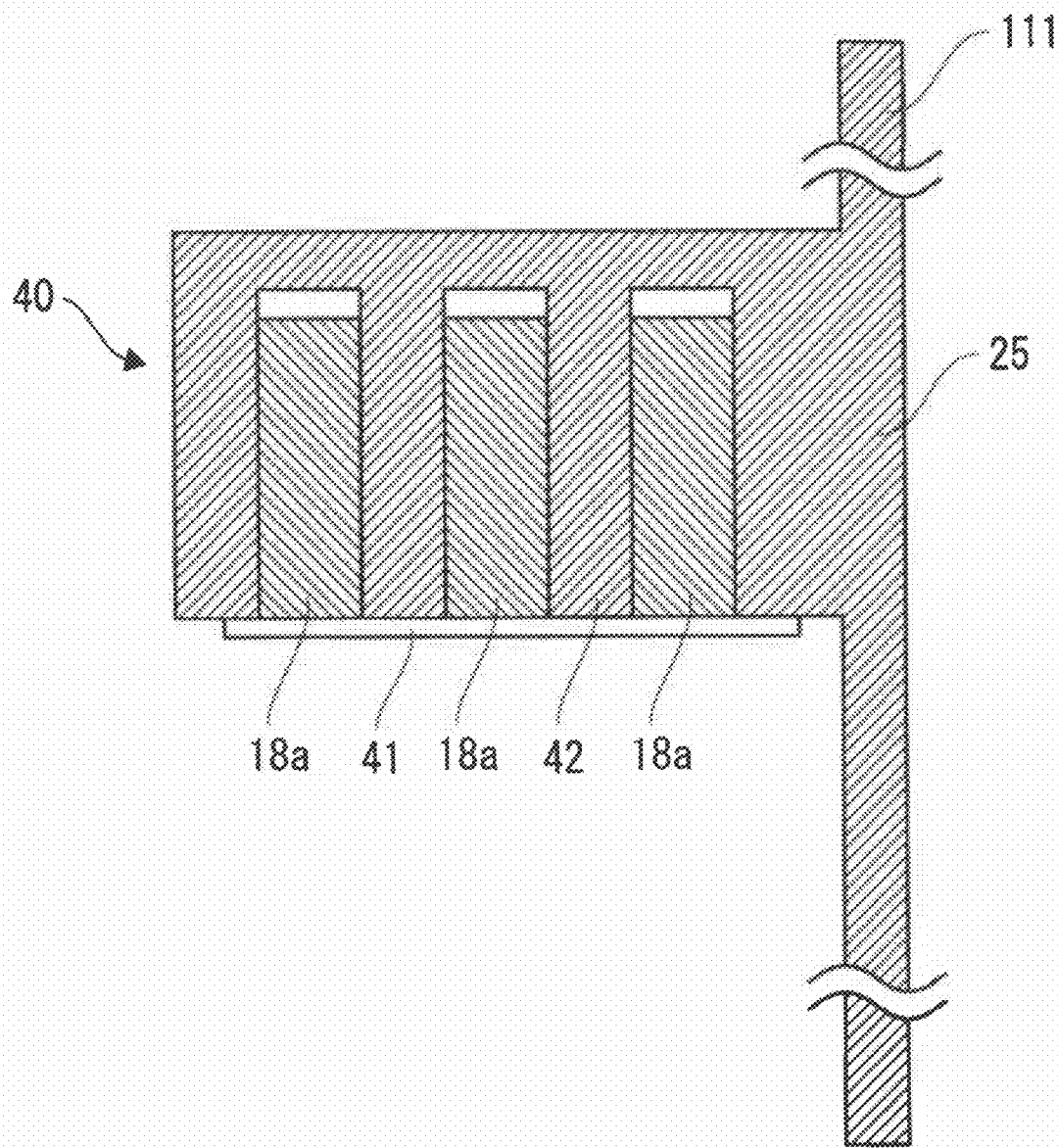
FIG. 11 is a plane view illustrating a structure of a dummy pattern in accordance with a fourth exemplary embodiment of the present invention.

In a fourth exemplary embodiment, a plurality of second electrodes 42 in the dummy pattern 40 are all electrically connected. Note that the other structures and manufacturing method and the like are the same as the third exemplary embodiment, and therefore explanation of them are omitted. A dummy pattern 40 of this exemplary embodiment of the present invention is explained with reference to FIG. 11. FIG. 11 is a plane view illustrating a structure of the dummy pattern 40.

As shown in FIG. 11, in this exemplary embodiment of the present invention, the upper ends of the plurality of second electrodes protrude beyond the upper edge of the dummy back channel regions 18a. Further, the upper ends of the plurality of second electrodes are connected with the conductive film 25 extending from the source line 111. That is, the conductive film 25 is formed in a comb-shape in the dummy pattern 40. In this way, no conductive film 25 is electrically isolated after the manufacturing process has been completed. This exemplary embodiment of the present invention can also achieve similar advantageous effects to those of the first exemplary embodiment.

Fifth Exemplary Embodiment

Figure 12:
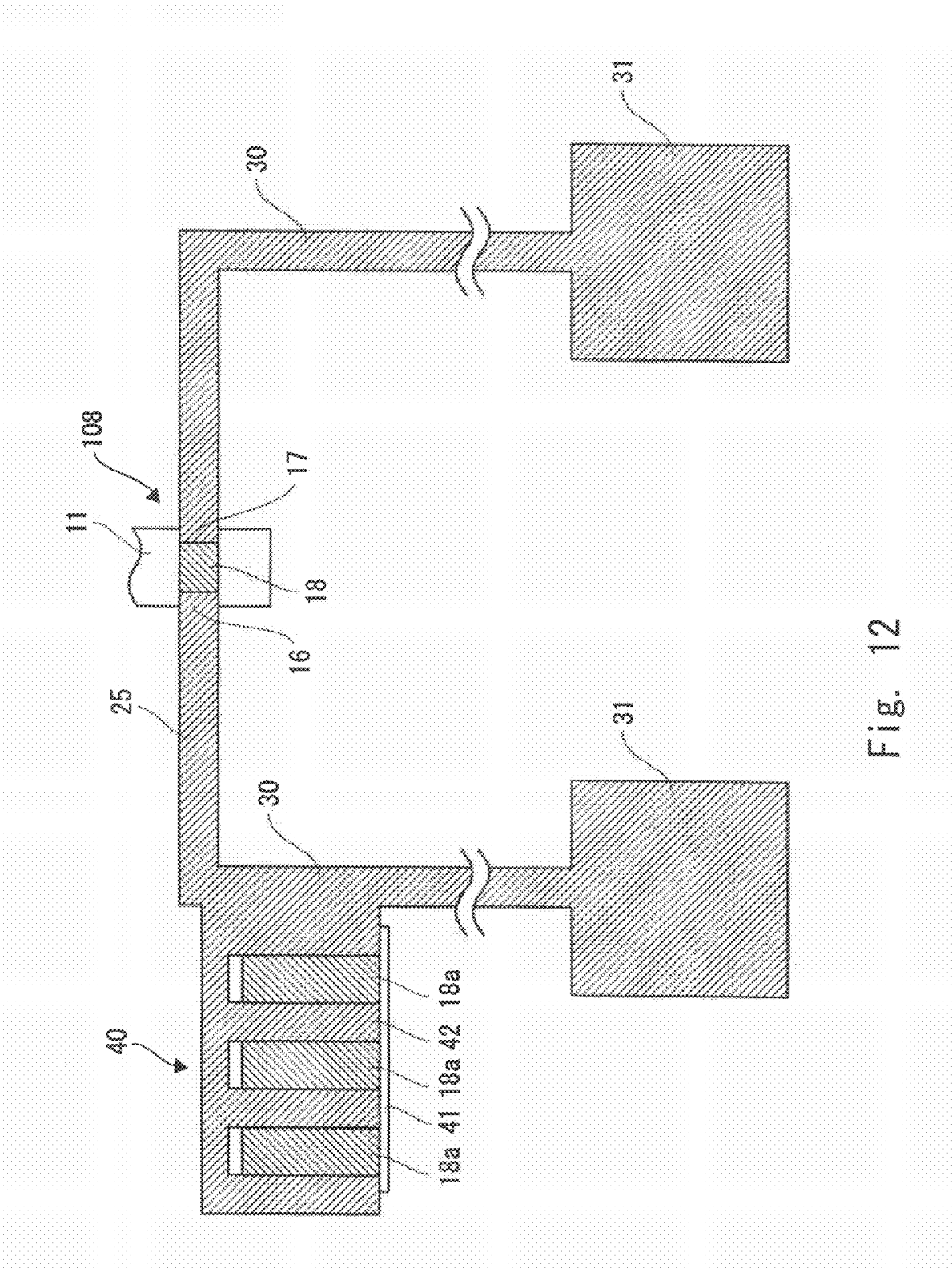
FIG. 12 is a plane view illustrating a structure of a TEG in accordance with a fifth exemplary embodiment of the present invention.
Figure 13:
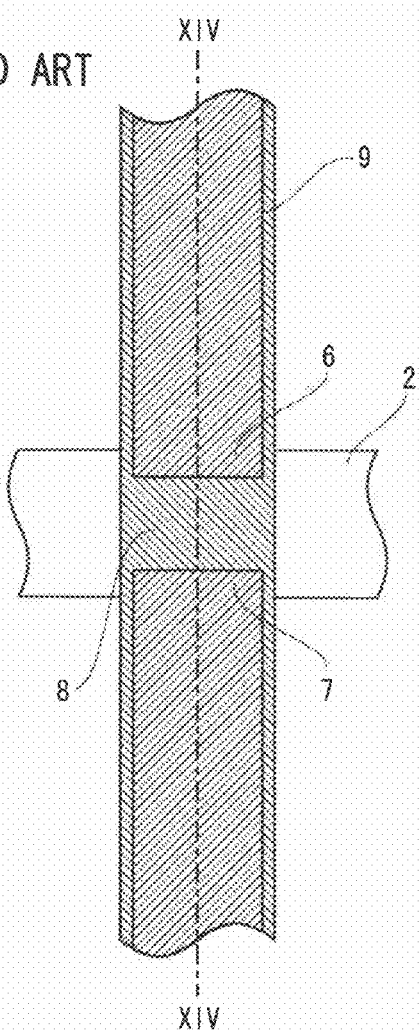
FIG. 13 is a plane view illustrating a structure of a TFT in the related art.
Figure 14:
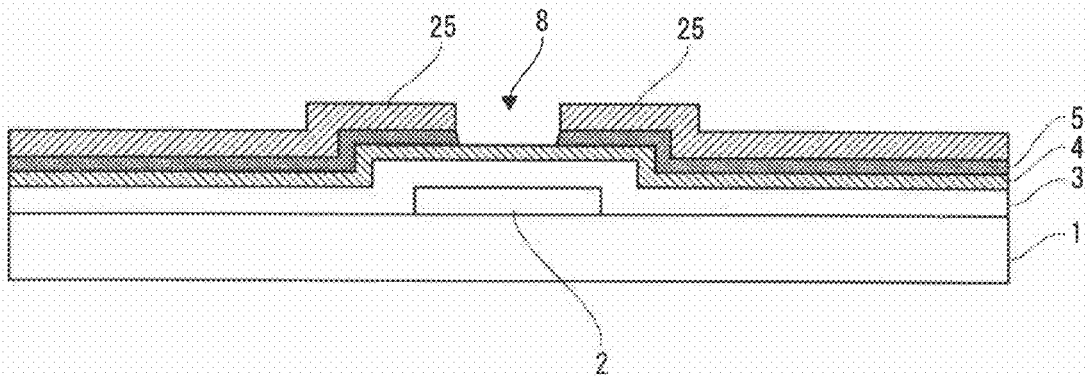
FIG. 14 is a cross sectional view taken along the line XIV-XIV in FIG. 13.

In a fifth exemplary embodiment of the present invention, the dummy pattern 40 is also applied, in addition to the internal circuits of the finished product, to TEGs that are used for monitoring in the manufacturing process. Needless to say, structures other than the TEGs may be similar to those of the first to fourth exemplary embodiment of the present invention. A structure of a TEG that is used to measure the characteristics of one TFT 108 is explained hereinafter with reference to FIG. 12. FIG. 12 is a plane view illustrating a structure of a TEG. In this example, explanation is made with a TEG having the same shape as the TFT 108. However, it should be noted that various TEGs having different structures are prepared in the manufacture of actual products.

A TFT 108 connected to a TEG shown in FIG. 12 is formed in the frame region 102 shown in FIG. 1. The TFT 108 has the same structure and the same size as the first exemplary embodiment of the present invention. That is, it has a pattern having the same shape and the same size as those of the TFT 108 formed in the display region 101 shown in FIG. 1. In this way, it is possible to measure the characteristics of a TFT 108 for driving a pixel. Furthermore, lead-out lines 30 each extending from the source electrode 16 and drain electrode 17 respectively of this TFT 108 are formed. The lead-out line 30 that extends from the source electrode 16 corresponds to the source line 111. Each of the lead-out lines 30 has a pad portion 31 at its end. Each pad portion 31 has a rectangular shape. The pad portions 31 are disposed so as to connect with measuring probes. Furthermore, the gate electrodes 11 are connected to pad portions to which measuring probes are connected.

For example, a gate signal is input to the pad portion connected to the gate electrode 11. Furthermore, a source signal is input to the pad portion 31 connected to the source electrode 16. Then, a current or the like is detected at the pad portion 31 connected to the drain electrode 17. In this way, the characteristics of the TFT 108 can be measured. Note that the lead-out lines 30 and the pad portions 31 constituting TEGs are formed from the conductive film 25. Further, a dummy pattern 40 is connected to the lead-out line 30 on the source electrode 16 side. In FIG. 12, the dummy pattern 40 is connected to the lead-out line 30 on the left side. Furthermore, the dummy pattern 40 in this example has a similar structure to that of the fourth exemplary embodiment of the present invention.

This exemplary embodiment of the present invention can also achieve similar advantageous effects to those of the first exemplary embodiment. Furthermore, in the above-described TEG, since the pad portion 31 is connected to a measuring probe, a quadrangular pad with sides of, typically, around 100 to 200 μm is often used. In addition, only one TFT 108 is connected to this line. Therefore, the area ratio R tends to become larger. Accordingly, advantageous effects obtained by the present invention will become more prominent.

Note that although the dummy pattern 40 is connected to the lead-out line 30 on the left side in FIG. 12, the dummy pattern 40 may be connected to the lead-out line 30 on the right side or on each side. That is, the dummy pattern 40 is connected to the lead-out line 30 on the drain electrode 17 side or on each side. Furthermore, although the dummy pattern 40 having a similar structure to the fourth exemplary embodiment, it may have a similar structure to any of the first to third exemplary embodiment. Even in such cases, similar advantageous effects can be obtained.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A TFT substrate having a TFT, comprising:
a semiconductor film including an intrinsic semiconductor film and an impurity semiconductor film, and having a back channel region of the TFT where the impurity semiconductor film on the intrinsic semiconductor film is removed;
a conductive film for a source line formed on the semiconductor film, formed inside the semiconductor film, and including a source line configured to supply a source signal to the TFT; and
a dummy back channel region located in a portion other than the TFT region and being irrelevant to the operation of a finished product,
wherein over the dummy back channel region, the conductive film for a source line on the semiconductor film is removed.

2. The TFT substrate according to claim 1, wherein when an aggregate of an area of the back channel region and an area of the dummy back channel region in a pattern of one independent intrinsic semiconductor film is defined to be 1, an area of the conductive film for a source line is equal to or less than 100.

3. The TFT substrate according to claim 1, wherein at least one dummy back channel region is connected to the conductive film for a source line formed on the semiconductor film.

4. The TFT substrate according to claim 1, wherein a plurality of dummy back channel regions and a plurality of conductive films for a source line are alternately formed.

5. The TFT substrate according to claim 4, wherein the plurality of the conductive films for a source line are electrically connected.

6. The TFT substrate according to claim 1, further comprising a TEG to measure the TFT,
wherein the dummy back channel region is connected to the TEG.

* * * * *